United States Patent [19]

Seno et al.

[11] 4,051,550

[45] Sept. 27, 1977

[54] THICK FILM INTEGRATED CIRCUITS

[75] Inventors: Shougo Seno; Tatsuro Toyama, both of Yokohama; Teruo Takai, Isehara; Yasuomi Ueda, Yokohama, all of Japan

[73] Assignee: Hitachi, Ltd., Japan

[21] Appl. No.: 635,237

[22] Filed: Nov. 25, 1975

[30] Foreign Application Priority Data

Nov. 29, 1974 Japan ............................... 49-136193

[51] Int. Cl.² ............................................. H05K 1/04
[52] U.S. Cl. ...................................... 361/402; 361/411
[58] Field of Search .......................... 174/68.5, 52 FP; 361/411, 460, 402; 338/164, 163, 162, 48, 308, 309, 307

[56] References Cited

U.S. PATENT DOCUMENTS

| 2,474,988 | 7/1949 | Sargrove | 174/68.5 |
| 2,883,499 | 4/1959 | Kilby et al. | 317/101 C |
| 2,970,244 | 1/1961 | Beverly et al. | 317/101 C |
| 3,404,215 | 10/1968 | Burks et al. | 174/52 FP |

Primary Examiner—David Smith, Jr.
Attorney, Agent, or Firm—Craig & Antonelli

[57] ABSTRACT

A thick film integrated circuit comprises a ceramic substrate, conductors formed on one surface of the ceramic substrate, circuit components mounted on the one surface of the ceramic substrate, a resistance for a variable resistor formed on the other surface of the ceramic substrate, variable resistor elements including an adjusting shaft and a slider member constituting the variable resistor formed in cooperation with the resistance, and means for mounting the elements of the variable resistor on the other surface of the ceramic substrate.

6 Claims, 5 Drawing Figures

THICK FILM INTEGRATED CIRCUITS

The present invention relates to a thick film integrated circuit formed on a ceramic substrate and in particular to a thick film integrated circuit having a plurality of variable resistors incorporated therein.

The thick film integrated circuit according to the invention can be suitably applied to a circuit in which a plurality of variable resistors are employed, and particularly to a circuit for a cathode-ray tube (hereinafter referred to simply as CRT) of a color televison receiver which serves to provide electric signals and/or power to electrodes of the CRT.

Heretofore, in a circuit for the CRT of a color television receiver, a socket for the CRT, a spark gap forming a discharge path upon occurrence of discharge with in the CRT, capacitors, variable resistors for adjusting the screen image in respect of colors, i.e. red, green and blue, and associated resistors are incorporated in a single substrate. The circuit unit or block (hereinafter referred to as a circuit unit for the CRT) thus constructed is adapted to be installed on the CRT by inserting the socket for the CRT to the associated terminals thereof. The reason for assemblying of the variable resistors for the screen adjustment, the spark gap etc. on a single substrate as a circuit unit for the CRT which is then supported on the neck portion of the CRT is based on the following grounds:

1. The space within the cabinet of the television receiver can be effectively utilized. More specifically, the chasis of the television receiver is generally installed within the cabinet along the front face thereof, which produces an available space in the vicinity of the neck portion of the CRT. This space can be utilized by the circuit unit assembled as described above.
2. When the circuit unit for the CRT is not held by the neck portion of the CRT, a number of wires are required for the connection between the socket of the CRT and the circuit unit. With such an arrangement, the stray capacitance is increased incurring a degradation in the electric characteristics and, in addition, an increased amount of the wire material involves a corresponding increasement of costs. On the contrary, when the circuit for the CRT is mounted on the neck portion of the CRT as a circuit unit, the quantity of wires for interconnecting the circuit unit and other circuitries is reduced, whereby the deterioration of electric characteristic and the high cost of the circuit can be avoided.

However, the hitherto known circuit unit is disadvantageous in that a relatively large substrate has been required and the circuit unit itself is combustible as will be described in more detail hereinafter.

Accordingly, an object of the present invention is to provide a novel and advantageous thick film integrated circuit.

Another object of the invention is to provide an incombustible thick film integrated circuit.

Still another object of the invention is to provide a thick film integrated circuit which can be miniaturized with a high packing density.

A further object of the invention is to provide a thick film integrated circuit having a high reliability.

According to one aspect of the invention, there is provided a thick film integrated circuit comprising a ceramic substrate, conductors formed on one surface of said ceramic substrate, printed fixed resistances formed on the one surface of said ceramic substrate in contact with said conductors, externally mounted circuit components mounted on the one surface of said ceramic substrate and electrically connected to the conductors, a printed resistance for a variable resistor formed on the other surface of said ceramic substrate, elements of the variable resistor including an adjusting shaft and a slider which constitute said variable resistor in cooperation with said printed resistance, and means for mounting said variable resistor elements on the other surface of said ceramic substrate.

With the above construction of the thick film integrated circuit according to the invention, the desired incombustibility can be attained, since the substrate is formed of a ceramic material and the resistors which constitute heat generating elements are composed of the printed and fired resistors.

Further, according to the invention, the externally mounted circuit components are mounted on one surface of the ceramic substrate, while the variable resistor is provided on the other surface of the substrate, whereby the packing density can be increased, permitting the use of a miniaturized substrate.

According to another feature of the present invention, the resistance of the variable resistor is constituted by the printed resistance which is insusceptible to variations in the resistance value due to electrolytic corrosion. Thus, the reliability of the circuit can be remarkably enhanced as compared with the conventional circuit in which a carbon film resistance is employed for the variable resistor.

According to the invention, the conductors and the printed fixed resistance may be provided on both surfaces of the ceramic substrate rather than on the one surface thereof.

In the case where the conductors are formed also on the other surface of the ceramic substrate, the externally mounted circuit components mounted on the one surface of the ceramic substrate can be connected to the conductors formed on either surface of the substrate.

At this point, the phase "externally mounted circuit components" as herein used will mean those components which cannot be formed on the ceramic substrate by a printing and firing process but mounted individually on the substrate by connecting to the conductors on the substrate by soldering or welding.

In the embodiment of the invention described hereinafter, the adjusting shaft for the variable resistor is constituted by a rotating shaft which can be rotatably mounted on the ceramic substrate merely by inserting the shaft through an associated hole formed in the ceramic substrate. A slider or wiper member secured to the rotating shaft is then positioned to contact with the printed resistance, thus constituting a variable resistor. However, the invention is never restricted to such a construction. For example, the ceramic substrate may be formed with an elongated rectangular slot having longitudinal side portions formed with printed and fired resistance layers for the variable resistor. The adjusting shaft is inserted in the elongated rectangular slot with a slider member thereof being contacted with the resistance layer. The shaft is of course mounted on the ceramic substrate so as to be displaceable along the elongated slot, whereby a linear variable resistor can be obtained. As a means for mounting the adjusting shaft displaceably along the elongated slot, a variety of known devices such as fastener formed at the tip of the adjusting shaft may be conveniently employed.

An important feature of the present invention can be seen in the arrangement such that one surface of the ceramic substrate serves for mounting the externally mounted circuit components, while the variable resistor including the printed resistance is disposed on the other surface of the substrate. The adjusting shaft and the slider member for the variable resistor may be of a known type and can be mounted on the ceramic substrate in a conventional manner.

The above and other objects and features of the present invention will become apparent from the following detailed description made in conjunction with the accompanying drawings in which.

In the first place, a structure of a hitherto known circuit unit for a CRT will be described by referring to FIG. 1, in order to provide a better understanding of the invention.

Figure 1:
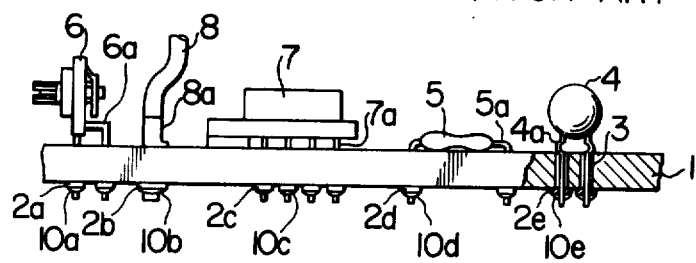
FIG. 1 is a partial cross sectional view showing a hitherto known circuit unit for the CRT.

In FIG. 1, reference numeral 1 designates an insulation plate made of a phenol resin material, which is provided at the lower surface thereof with copper foil conductors 2a, 2b, 2c, 2d and 2e and having holes 3 at appropriate locations. Terminals 4a, 5a, 6a, 7a and 8a of lead wires of various components such as a capacitor 4, a fixed resistor 5 of a carbon film type, a variable resistor 6 of a carbon film type for adjustment of screen image and a socket 7 for the CRT as well as wires 8 are inserted into the terminal receptacle holes 3 from the top or upper side of the insulation plate 1 and connected to the copper foils 2a to 2e by soldering. Reference numerals 10a, 10b, 10c, 10d and 10e indicate solder material.

The conventional circuit unit for the CRT having a construction as described above has a drawback that the package density of the circuit components is relatively low because all the electronic components are disposed at the upper surface of the insulation plate 1, which has thus to be of a relatively large size.

Furthermore, when discharge takes place within the CRT, the heat producing elements of the circuit unit for the CRT such as the resistor 5 is subjected to a large amount of current flow, whereby heat is generated by such a component. For this reason, it is necessary to make the circuit unit for the CRT incombustible. However, such a requirement of incombustibility is not fulfilled in the conventional circuit unit, since the insulation plate of paper and phenol resin material such as the one employed in the circuit unit shown in FIG. 1 as well as the insulation plates conventionally used for printed circuit plates and the commonly used resistance material such as carbon film or the like are in general easily combustible.

Another disadvantage of the conventional circuit unit for the CRT can be seen in the fact that the resistance portion of commonly employed valiable resistors is made of a carbon film or layer and is susceptible to be electrolytically corroded under the influence of temperature and moisture, which results in a degradation of the characteristic of such variable resistors. For example, when current flows through the contact portion between the carbon film and the contact wiper under the moistured condition caused by deposition of a water drop, the carbon film tends to be oxidized, involving a deterioration in the characteristic.

It is certainly contemplated to integrate the conventional circuit unit for the CRT in the form of a thick film structure by employing a ceramic substrate. This structure may improve the incombustibility of the circuit unit. However, the other disadvantages as mentioned above can not be succesfully eliminated of even with the thick film integrated circuit structure.

Now, the invention will be described in detail with reference to FIGS. 2 to 5 which show a preferred embodiment of the invention by way of example in which the principle of the thick film integrated circuit is applied to the circuit unit for the CRT in accordance with the invention.

Referring to FIGS. 2 to 5, there is employed according to the invention a ceramic substrate or plate 11 made of alumina, forsterite or the like material which is perforated with through-holes 12a, 12b, 12c, 13 and 14. The ceramic substrate 11 is provided at both surfaces thereof with an electrically conductive material such as silver, palladium or the like to form conductors by a printing process. Furthermore, the hole 13 may also be applied with the conductor material to interconnect the circuit conductors deposited on the both surfaces of the substrate 11. For the application of conductor material on the peripheral surface of the hole 13, the latter may be first filled with the conductor material and thereafter pierced with a rod having a diameter slightly smaller than that of the hole 13. Alternatively, the interconnection between the conductors formed on the both sides of the ceramic substrate 11 of the illustrated embodiment may be realized with the aid of a pin inserted through the hole 13 without resorting to the application of conductor material.

When the ceramic substrate 11 has been printed with conductor material at the both surfaces thereof with the inner bore of the hole 13 having been coated with the same material, then the ceramic substrate 11 is fired at a temperature in a range from 750° C to 950° C, whereby a conductor pattern comprising conductors 15a to 15i as well as a conductor 18 for a variable resistor are fixedly formed. Subsequently, the ceramic substrate 11 is applied with a resistance material such as silver, palladium compounds, ruthenium compounds or the like through a printing process in such a manner that the resistance material is electrically connected to the conductors 15b, 15d, 15e and 15g. At the same time, the lower surface of the substrate 11 is printed with a resistance material for a variable resistor. The ceramic substrate 11 is then fired at a temperature lower than the firing temperature of the conductor material described above for 0° C to 200° C, thereby to form on the both surfaces of the substrate 11 fixed resistance films 16a, 16b and 16c along with a resistance layer 17 for the variable resistor on the lower surface of the substrate 11. In this connection, it is to be appreciated that the resistance material may be printed after the conductor material has been printed, both materials thereafter being fired simultaneously. The portions of the conductors 15a to 15i at which no soldering is required, the fixed resistors 16a, 16b and 16c, are additionally provided with protection films 19a to 19d and 19f of glass, resin or the like. The conductor 18 for the variable resistor is additionally provided with an extremely thin protection film 19e exhibiting negligible resistance.

Next, the conductors 15a, 15b, 15c, 15h and 15i formed on the upper surface of the ceramic substrate 11 are printed with solder pastes at the respective portions to which the lead wire terminals 4a, 7a, 8a and 20a of the exteriorly mounted circuit components such as a capacitor 4, socket 7 for the CRT, wire 8 and a discrete transistor 20 of a face mounting type are to be connected. Thereafter, the lead wire terminals 4a, 7a and 8a of the capacitor 4, socket 7 for the CRT and the wire 8 are inserted into the associated holes 12a, 12b and 12c formed in the ceramic substrate 11 from above, and at the same time the transistor 20 is placed in the position on the associated solder paste.

Those circuit components which are desirably to be mounted on the ceramic substrate 11 with a greater bonding strength such as the socket 7 for the CRT and the wire 8 should preferably be fixed to the substrate 11 at the both surfaces of the substrate 11 by soldering. To this end, the lead wire terminals 7a and 8a of these components should be applied with the solder paste at the portions thereof at which the terminals 7a and 8a are connected to the conductors 15a and 15c formed on the upper surface of the ceramic substrate 11, before the terminals of these components are inserted into the respective holes.

When the lower surface of the ceramic substrate 11 is then placed in contact with a flow solder bath, the lead wire terminals 4a, 7a and 8a are bonded to the conductor 15b formed on the lower surface of the ceramic substrate by the flowing solder material, while at the same time the upper portions of the lead wire terminals 20a, 7a and 8a of the transistor 20, the socket 7 for CRT and the wire 8 are bonded to the conductors 15a, 15c, 15h and 15f on the upper surface of the substrate 11 by means of the solder paste printed thereon which is subjected to heat conducted thereto through the substrate 11.

Figure 2:
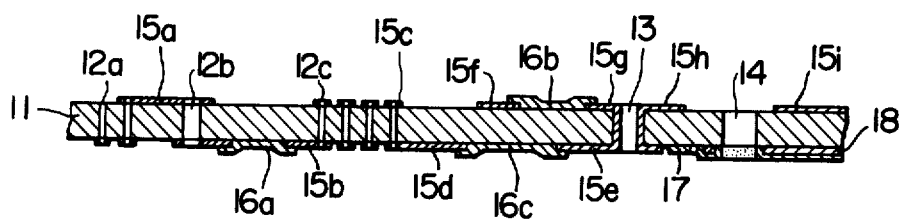
FIG. 2 shows in a cross section an embodiment of a thick film integrated circuit according to the invention which is applied to a circuit unit for a CRT in the state at which resistances and conductors are formed on the ceramic substrate.
Figure 3:
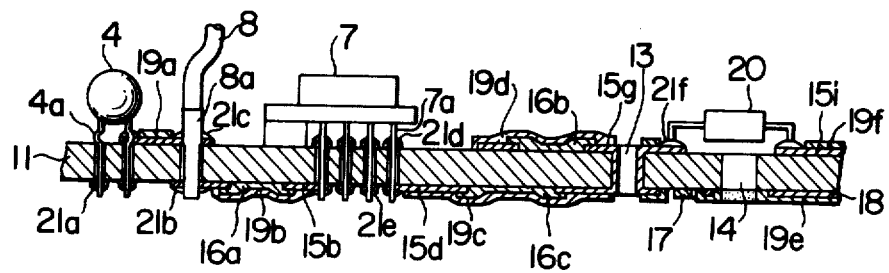
FIG. 3 is a cross sectional view showing the unit shown in FIG. 2 after the components such as the socket for the CRT has been mounted on the ceramic substrate.

In the case of the thick film circuit shown in FIGS. 2 and 3, the fixed resistor films 16a, 16b and 15c as well as the portions of conductors necessitating no soldering are coated with the protection films 19a to 19d and 19f of glass, resin or the like material to which solder will not adhere. The conductor 18 for the variable resistor is coated with an extremely thin protection film 19e which exhibits negligible resistance. The resistance layer 17 of the variable resistor is inherently non-adhesive to the solder material. Accordingly, deposition of solder material will not occur at the unnecessary portions. In FIG. 3, reference symbols 21a to 21f denote solder.

Figure 4:
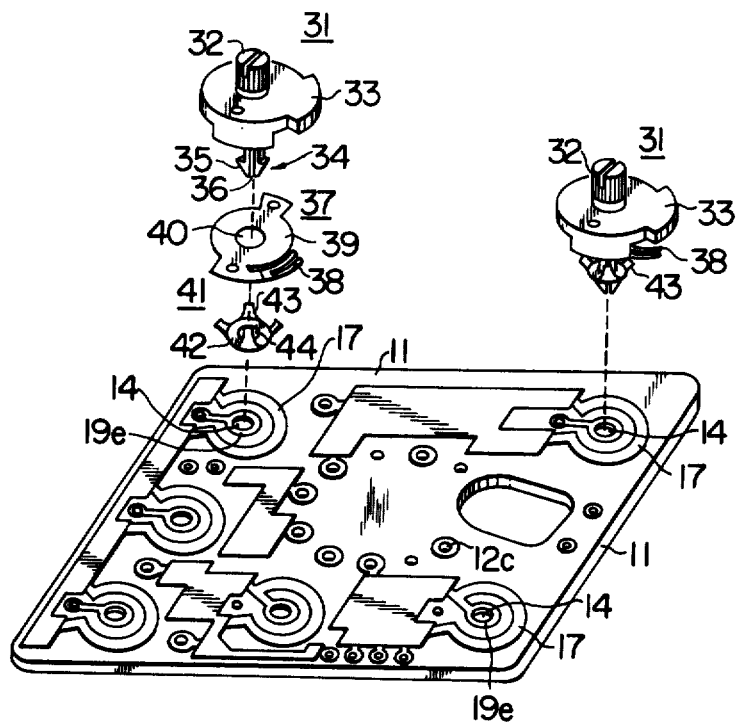
FIG. 4 is a perspective view of the ceramic insulation plate shown in FIG. 3 as viewed from the side at which the resistance for the variable resistor is formed.

In FIG. 4, reference numeral 31 designates a rotating shaft assembly for the variable resistor which comprises a knob 32, a collar 33 and a fastener 34. The fastener portion 34 includes an arrow-like portion 35 which is split into two segments by a slit 36. Numeral 37 denotes a slider or wiper member composed of a sliding portion 38 and a mounting portion 39. The slider member 37 is formed with a hole 40 at the mounting portion 39, which hole 40 is inserted with the fastener portion 34, whereby the mounting portion 39 can be secured to the collar 33 of the rotating shaft 31. Numeral 41 indicates a spring washer having contact portions 42 and 43. When the variable resistor is assembled from the rotating shaft 31, slider member 37 and the spring washer 41, the mounting portion 39 is first secured to the collar 33 of the shaft 31 and thereafter the fastener 34 is inserted into the hole 44 formed in the contact portion 42 of the spring washer 41 and the hole 14 formed in the ceramic substrate 11. Upon insertion of the fastener portion 24 of the rotating shaft 21 into the hole 35, the arrow-like projection 35 is compressed due to the presence of the notched slit 36, which allows the facilitated passage of the projection 35 through the hole 14. When the fastener portion 34 is thus passed through the hole 14 to project from the opposite side of the substrate 11, the arrow-like projection 35 is then expanded due to the inherent resilience thereof, whereby the shaft 31 is mounted rotatably on the substrate 11. When the rotating shaft 31 is thus mounted on the substrate 11, the contact portion 42 of the spring washer 41 is positioned to contact the conductor for the variable resistor with a leg portion 43 thereof being in contact with the fixing portion 39 of the slider member 37. Further, the sliding portion 38 of the member 37 is placed in contact with the resistance layer 17 of the variable resistor. Upon rotation of the shaft 31, the slider or wiper member 38 is displaced slideably over the resistance layer 17 of the variable resistor. On the other hand, the slider member 38 and the protection film 19e on the conductor 18 for the variable resistor are electrically connected to each other. Thus, a completed variable resistor can be obtained.

Figure 5:
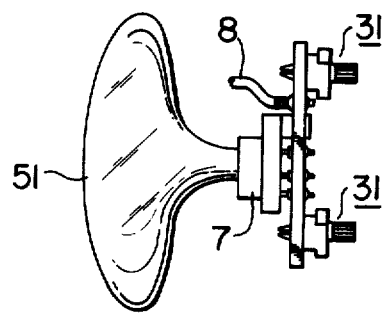
FIG. 5 is a side view illustrating the finished circuit unit according to the invention in the state mounted on a CRT.

The circuit unit for the CRT constructed in the above-described manner is now in the position to be installed on the CRT 51 by fitting the socket 7 to the terminal portion of the CRT, as is shown in FIG. 5.

It is to be noted that, although the protection film 19e is provided on the conductor 18 of the variable resistor, the resistance between the spring washer 41 and the contact portion 42 is negligible, since the protection film 19e is extremely thin.

As will be apparent from the foregoing description of the preferred embodiment of the invention in which the thick film integrated circuit according to the invention is adapted for the the circuit unit for CRT, the use of a ceramic plate for the substrate 11 having the printed resistors 16a, 16b and 16c will assure an increased incombustibility of the circuit unit.

Furthermore, the arrangement of the circuit components such that the externally mounted circuit components such as the capacitor 4, socket 7 for the CRT, wire 8 and the transistor 20 are mounted at one surface of the ceramic substrate 11, while the resistance layer 17 and the conductor 18 for the variable resistor are formed on the other surface of the ceramic substrate together with the rotating shaft 31, wiper member 37 and the spring washer 41 of the variable resistor mounted on the same surface of the substrate will allow a circuit unit having an increased packing density on a miniaturized substrate.

Additionally, according to the invention, the resistance of the variable resistor is provided by the printed resistance layer 17 which is scarcely susceptible to a variation in the resistance value due to the electrolytic corrosion. This feature will enhance the reliability of the circuit unit.

In the case of the conventional circuit unit for the CRT, the rotating shaft of the variable resistor is mounted in parallel with the substrate, which makes the adjustment of resistor rather difficult. On the contrary, according to the invention, the variable resistor is incorporated in the circuit unit for the CRT with the rotating shaft 31 thereof positioned with a right angle to the substrate at the opposite side of the CRT 51, thus facilitating the adjustment.

What we claim is:

1. A thick film integrated circuit comprising:
a ceramic substrate;
conductors formed on at least one surface of said ceramic substrate;
printed fixed resistances formed on at least one surface of said ceramic substrate so as to be connected to said conductors formed on said one surface;
a conductor for a variable resistor formed on the other surface of said ceramic substrate;
a protection film of negligible resistance formed on said conductor for said variable resistor;
a printed resistance for a variable resistor formed on the other surface of said ceramic substrate;
externally mounted circuit components mounted on the one surface of said ceramic substrate and electrically connected to said conductors;
the elements of the variable resistor including an adjusting shaft and a slider member which constitute said variable resistor in cooperation with said printed resistance for the variable resistor; and
means for mounting said variable resistor elements on the other surface of said ceramic substrate.

2. A thick film integrated circuit comprising:
a ceramic substrate formed with holes;
conductors formed on both surfaces of said ceramic substrate;
printed fixed resistances formed at least on one surface of said substrate so as to be connected to said conductors formed on said one surface;
first protection films which are non-adhesive to soldering material and formed at least on said conductors mounted on the other surface of said substrate except for a soldering portion thereof;
a conductor for a variable resistor formed on the other surface of said ceramic substrate;
a second protection film of negligible resistance formed on said conductor for said variable resistor;
a printed resistance for said variable resistor formed on the other surface of said ceramic substrate;
externally mounted circuit components having lead wires inserted through said holes from the one surface of said substrate and electrically connected to at least those of said conductors formed on the one surface of said substrate;
the elements of the variable resistor including an adjusting shaft and a slider member which constitute said variable resistor in cooperation with said printed resistance for the variable resistor; and
means for mounting said variable resistor elements on the other surface of said ceramic substrate.

3. A thick film integrated circuit as set forth in claim 2, further comprising means for connecting said conductors formed on the one surface of said ceramic substrate to the conductors formed on the other surface through said holes formed in said ceramic substrate.

4. A thick film integrated circuit comprising:
a ceramic substrate formed with a plurality of first holes and a second hole;
conductors formed on both surfaces of said ceramic substrate;
printed fixed resistances formed on both surfaces of said substrate so as to be connected to said conductors;
first protection films which are non-adhesive to soldering material and formed on said conductors except for a soldering portion thereof;
a conductor for a variable resistor formed on the other surface of said ceramic substrate around said second hole;
a second protection film of negligible resistance formed on said conductor for said variable resistor except for a soldering portion thereof;
a printed resistance for said variable resistor formed around said conductor for the variable resistor;
externally mounted circuit components having lead wires inserted through said first holes from the one surface of said substrate and electrically connected to at least those of said conductors formed on the one surface of said substrate;
a rotating shaft having a collar portion and fastener portion;
a slider member secured to said collar portion of said rotating shaft; and
means for mounting rotatably said rotating shaft on said ceramic substrate with said slider member placed in contact with said resistance and conductor for the variable resistor by the insertion of said fastener portion of said rotating shaft into said second hole from the other surface of said ceramic substrate.

5. A thick film integrated circuit as set forth in claim 4, further comprising means for connecting said conductors formed on both surfaces of said ceramic substrate through holes formed therein.

6. A thick film integrated circuit comprising:
a ceramic substrate formed with a plurality of first holes, a second hole and third holes;
conductors formed on both surfaces of said ceramic substrate;
printed fixed resistances formed on both surfaces of said ceramic substrate and connected to said conductors;
first protection films which are non-adhesive to soldering material and formed on said printed fixed resistances and said conductors except for soldering portions thereof;
a conductor for a variable resistor formed on the other surface of said ceramic substrate around said second hole;
a second protection film of negligible resistance formed on said conductor for said variable resistor except for a soldering portion thereof;
a printed resistance for the variable resistor formed around said conductor of the variable resistor;
a first externally mounted circuit component of a face mounting type soldered to the conductors formed on the one surface of said substrate;
second externally mounted circuit components except for said component of the face mounting type having lead wires inserted through said first holes from one surface of said substrate and soldered to at least the conductors formed on one of said surfaces of said ceramic substrate;
a rotating shaft having a collar portion and a fastener portion;

a slider member secured to said collar portion of said shaft;

means for mounting rotatably said rotating shaft with said slider member positioned in contact with said printed resistance and the conductor for the variable resistor by the insertion of said fastener portion of said rotating shaft through said second hole from the other side of said ceramic substrate; and means for electrically interconnecting said conductors formed on both surfaces of said ceramic substrate through said third holes.

* * * * *